United States Patent
Dennison et al.

(10) Patent No.: US 9,557,376 B2
(45) Date of Patent: Jan. 31, 2017

(54) APPARATUSES AND METHODS FOR DIE SEAL CRACK DETECTION

(71) Applicant: Micron Technology, Inc., Boise, ID (US)

(72) Inventors: Charles H. Dennison, Meridian, ID (US); Kenneth W. Marr, Boise, ID (US); Deepak Thimmegowda, Boise, ID (US); Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/069,316

(22) Filed: Mar. 14, 2016

(65) Prior Publication Data

US 2016/0195581 A1    Jul. 7, 2016

Related U.S. Application Data

(62) Division of application No. 14/106,190, filed on Dec. 13, 2013, now Pat. No. 9,287,184.

(51) Int. Cl.
| | |
|---|---|
| *G01R 31/28* | (2006.01) |
| *H01L 21/66* | (2006.01) |
| *H01L 23/48* | (2006.01) |
| *H01L 23/485* | (2006.01) |
| *H01L 29/78* | (2006.01) |

(52) U.S. Cl.
CPC .......... *G01R 31/2896* (2013.01); *H01L 22/14* (2013.01); *H01L 22/34* (2013.01); *H01L 23/48* (2013.01); *H01L 23/481* (2013.01); *H01L 23/485* (2013.01); *H01L 29/7823* (2013.01); *H01L 2924/0002* (2013.01)

(58) Field of Classification Search
CPC ............................. G01R 31/28; G01R 31/2896
See application file for complete search history.

(56) References Cited

U.S. PATENT DOCUMENTS

| | | | |
|---|---|---|---|
| 6,649,986 | B1 | 11/2003 | Ishizaki |
| 9,287,184 | B2 | 3/2016 | Dennison et al. |
| 2005/0194649 | A1 | 9/2005 | Oki |
| 2007/0096092 | A1 | 5/2007 | Huang et al. |
| 2007/0262370 | A1 | 11/2007 | Okada |
| 2008/0012572 | A1 | 1/2008 | Tsukuda |
| 2008/0128893 | A1 | 6/2008 | Uno |
| 2009/0201043 | A1 | 8/2009 | Kaltalioglu |
| 2009/0321734 | A1* | 12/2009 | Ogawa .................... H01L 22/34 257/48 |
| 2011/0221460 | A1 | 9/2011 | Trebo et al. |
| 2015/0170979 | A1 | 6/2015 | Dennison et al. |

* cited by examiner

*Primary Examiner* — Peniel M Gumedzoe
(74) *Attorney, Agent, or Firm* — Schwegman Lundberg & Woessner, P.A.

(57) ABSTRACT

Apparatuses and methods can include a die seal between an integrated circuit region of a die and a periphery of the die. A via chain(s) may be arranged around an inner circumference of the die seal between the die seal and the integrated circuit region and/or around an outer circumference of the die seal between the die seal and the periphery of the die. The via chain may include a plurality of contacts comprised of conductive material and extending through portions of the die. Circuitry may be coupled to an end of the via chain to detect an electrical signal. Additional apparatuses and methods are described.

5 Claims, 5 Drawing Sheets

APPARATUSES AND METHODS FOR DIE SEAL CRACK DETECTION

PRIORITY APPLICATION

This application is a divisional of U.S. application Ser. No. 14/106,190, filed Dec. 13, 2013, which is incorporated herein by reference in its entirety.

BACKGROUND

Some integrated circuit (IC) devices are manufactured with a die seal to protect the IC device from mechanical cracks. Mechanical cracks may nevertheless break through the die seal, leading to failures of the IC device. These mechanical cracks may be difficult to detect.

BRIEF DESCRIPTION OF THE DRAWINGS

Some embodiments are illustrated by way of example and not limitation in the figures of the accompanying drawings in which.

DETAILED DESCRIPTION

For the purposes of this document, an "apparatus" can refer to any of a number of structures, such as circuitry, a device, or a system. Potentials refer to electrical potentials.

Figure 1:
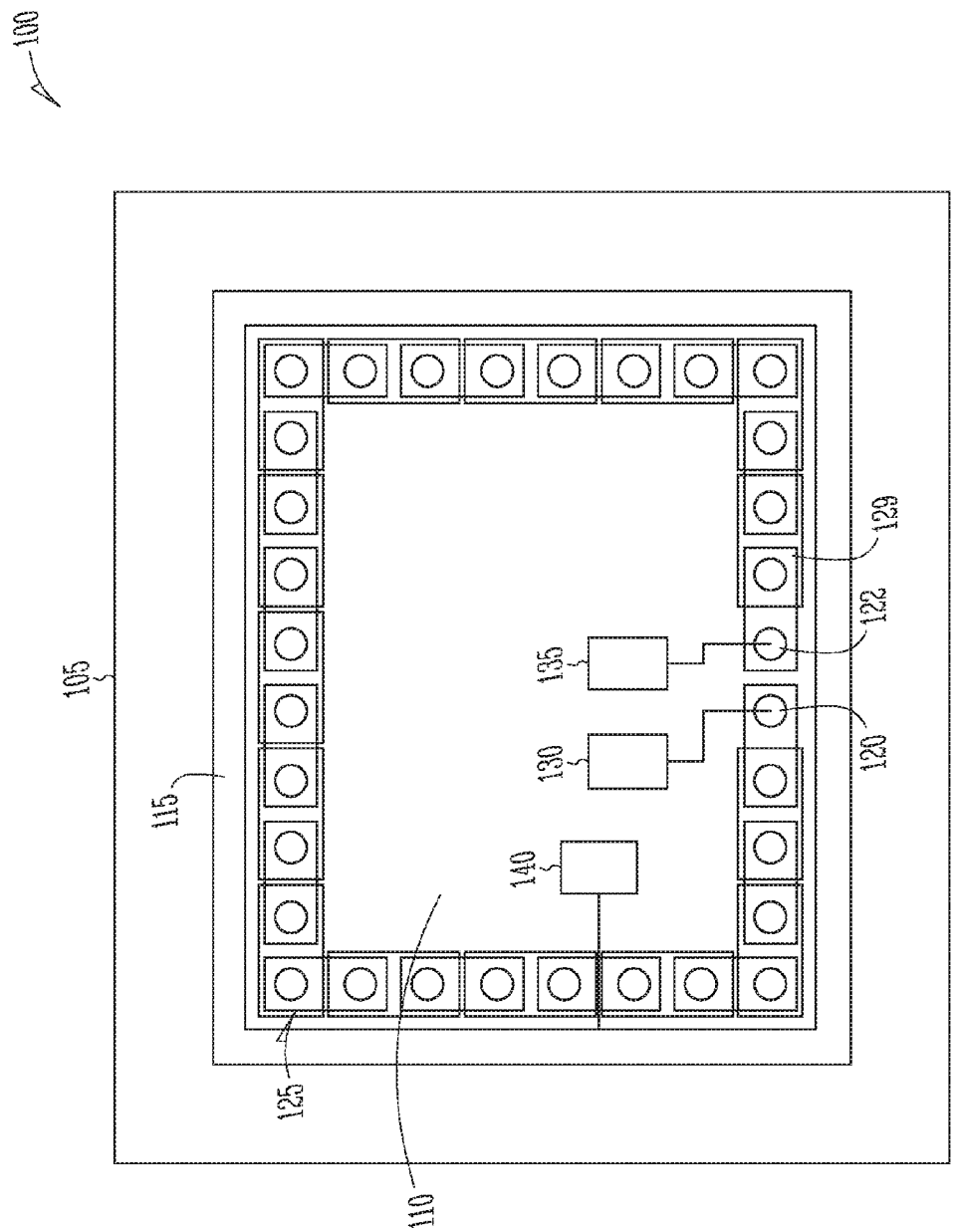
FIG. 1 is a block diagram of an apparatus in the form of a semiconductor device including a via chain for crack detection according to various embodiments.

FIG. 1 is a block diagram of an apparatus in the form of a die 100 including a via chain 125 for crack detection according to various embodiments.

During fabrication of the die 100, a device manufacturer may separate a semiconductor (e.g., silicon) wafer into individual dies 100 by performing a scribing operation in which the manufacturer dices (e.g., cuts, saws, or otherwise separates) the wafer along scribe lines, thereby defining a periphery 105 of the resultant separated die 100. While FIG. 1 depicts one die 100, a wafer may be separated into several dies.

Manufacturers may add a die seal 115 during die fabrication to help block cracks from propagating from the periphery 105 of the die to the integrated circuit region 110 during the scribing process or at other points during or after the fabrication process. The die seal 115 may also block moisture penetration or chemical damage. The die seal 115 may be located between the integrated circuit region 110 of the die 100 and the periphery 105 of the die 100. The die seal 115 may include a plurality of metal structures comprised of, for example, tungsten, to form a wall around the integrated circuit region 110.

However, even if a die seal 115 is used, cracks may propagate through the die seal 115 into the integrated circuit region 110. Additionally, some chip technologies may be especially prone to cracks. For example, a three-dimensional (3D) NAND memory device with stacked word lines may use, for example, CMOS Under Array (CUA) architectures. CUA architectures may exhibit various forms of film stress that may generate cracks. Example embodiments may provide methods and structures to electrically test for cracks in a die.

Some example embodiments may include a via chain 125 arranged around an inner circumference of the die seal 115 between the die seal 115 and the integrated circuit region 110.

Figure 2:
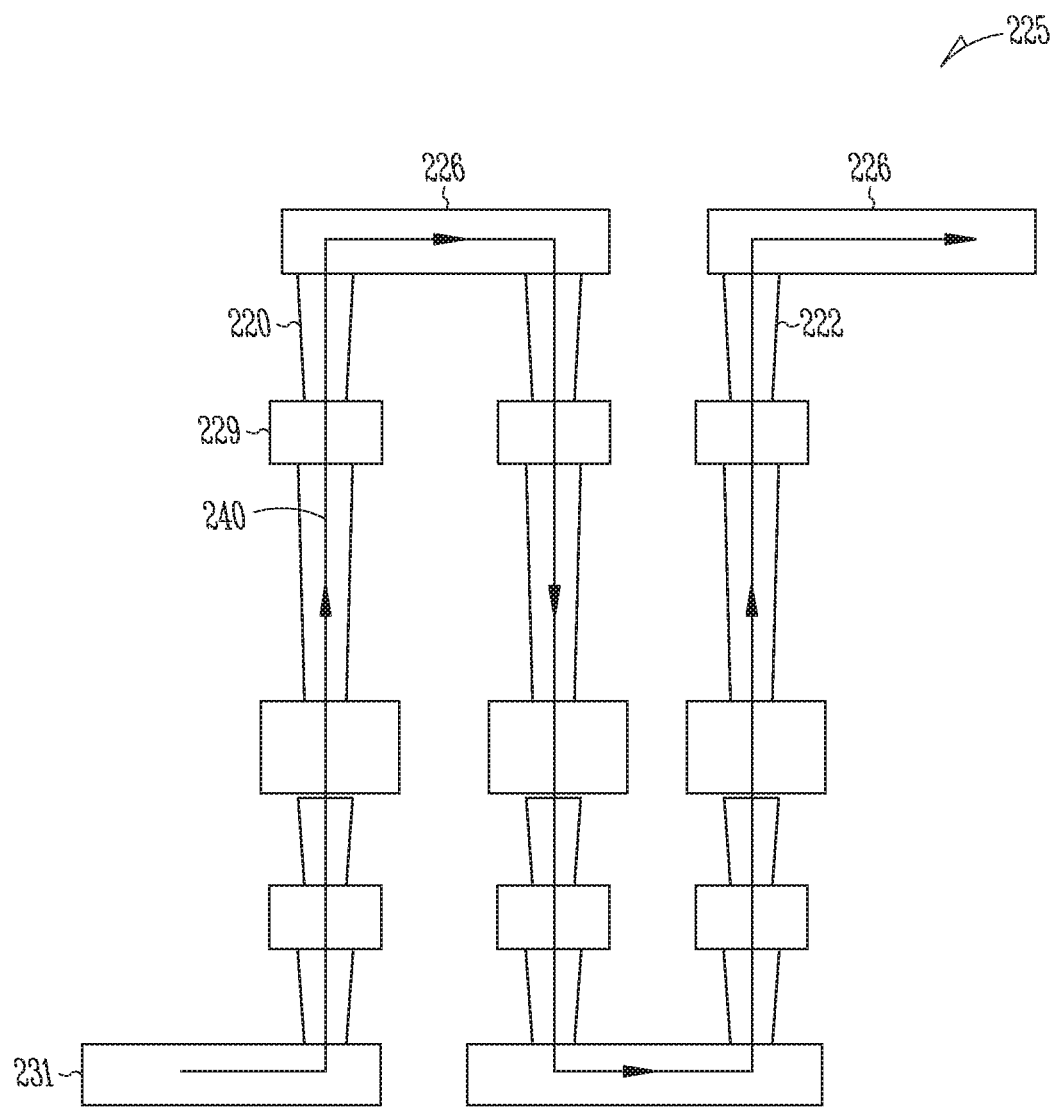
FIG. 2 is a partial cross-section showing a via chain according to various embodiments.

The die 100 may include a plurality of conductive portions (e.g., portions 129, where each portion 129 couples the contacts 120 of a respective pair of contacts). A contact 120 may extend through a portion of the die 100. A first group of one or more contacts 120 of the via chain 125 may extend from an upper conductive portion 129 of the die 100 to a lower conductive portion (e.g., portion 231 as shown in FIG. 2) of the die 100. A second group of one of more contacts 122 of the via chain 125 may also extend from the upper conductive portion 129 to a lower conductive portion of the die 100.

Example embodiments may include a first pad 130 coupled to a first end of the via chain 125 (e.g., the first group of contacts 120). Example embodiments may include a second pad 135 coupled to a second end of the via chain 125 (e.g., the second group of contacts 122). The contacts 120 and 122 may be electrically connected through the via chain, such that if a break occurs in the via chain, the detection circuitry can detect that break by detecting an open circuit. Example embodiments may further include a third pad 140 coupled to the die seal 115. The pads 130, 135, and/or 140 may be used to detect whether a crack has propagated through the die seal 115. For example, the pads may be coupled (e.g., during probe) to circuitry, such as pulldown devices (e.g., pulldown resistors), transceivers, or other circuitry, to detect whether an electrical signal is within a threshold range. The third pad 140 can be used to detect shorts between the via chain 125 and the die seal 115.

Such circuitry may be used to detect that a break has occurred in the via chain 125, signifying that a crack may have propagated through the die seal 115, by detecting that an open circuit has occurred. The circuitry may detect that the via chain 125 has shorted to the die seal 115. For example, cracks may allow metal to extrude from the die seal 115, creating a short circuit condition with the via chain 125, and the circuitry may detect that short circuit condition by measuring an electrical signal at one or more of the pads 130, 135 and/or 140.

FIG. 2 is a partial cross-section showing a portion of a via chain 225. The via chain 225 may be operable to serve as the via chain 125 (FIG. 1). The via chain 225 may form a conductive path 240. The various layers 226, 229, and 231, depicted in FIG. 2 may correspond to interconnect routing or gate layers of a 3D NAND device, for example, though example embodiments are not limited thereto. The via chain 125 interconnect layers can include tungsten, aluminum and poly interconnect layers. The contacts 220 and 222 can correspond to contacts 120 and 122 (FIG. 1).

Referring back to FIG. 1, circuitry may (e.g., during probe) couple to ends of the via chain 125 to detect whether the conductive path (e.g., conductive path 240) is broken. For example, a first pad 130 may couple to a first end of the via chain 125. A second pad 135 may couple to a second end of the via chain 125. If the conductive path (e.g., conductive path 240) is broken (e.g., if a failure has occurred at one of the contacts 220 and/or conductive layers), the circuitry coupled to pads 130, 135 may be used to determine that a crack has propagated through the die seal 115. For example, a horizontal crack, substantially perpendicular to a conductive layer of the die 100 (FIG. 1), or a vertical crack substantially parallel to a conductive layer of the die 100, may have propagated through the die seal 115, causing an open circuit or a short circuit in the via chain 125.

Figure 3:
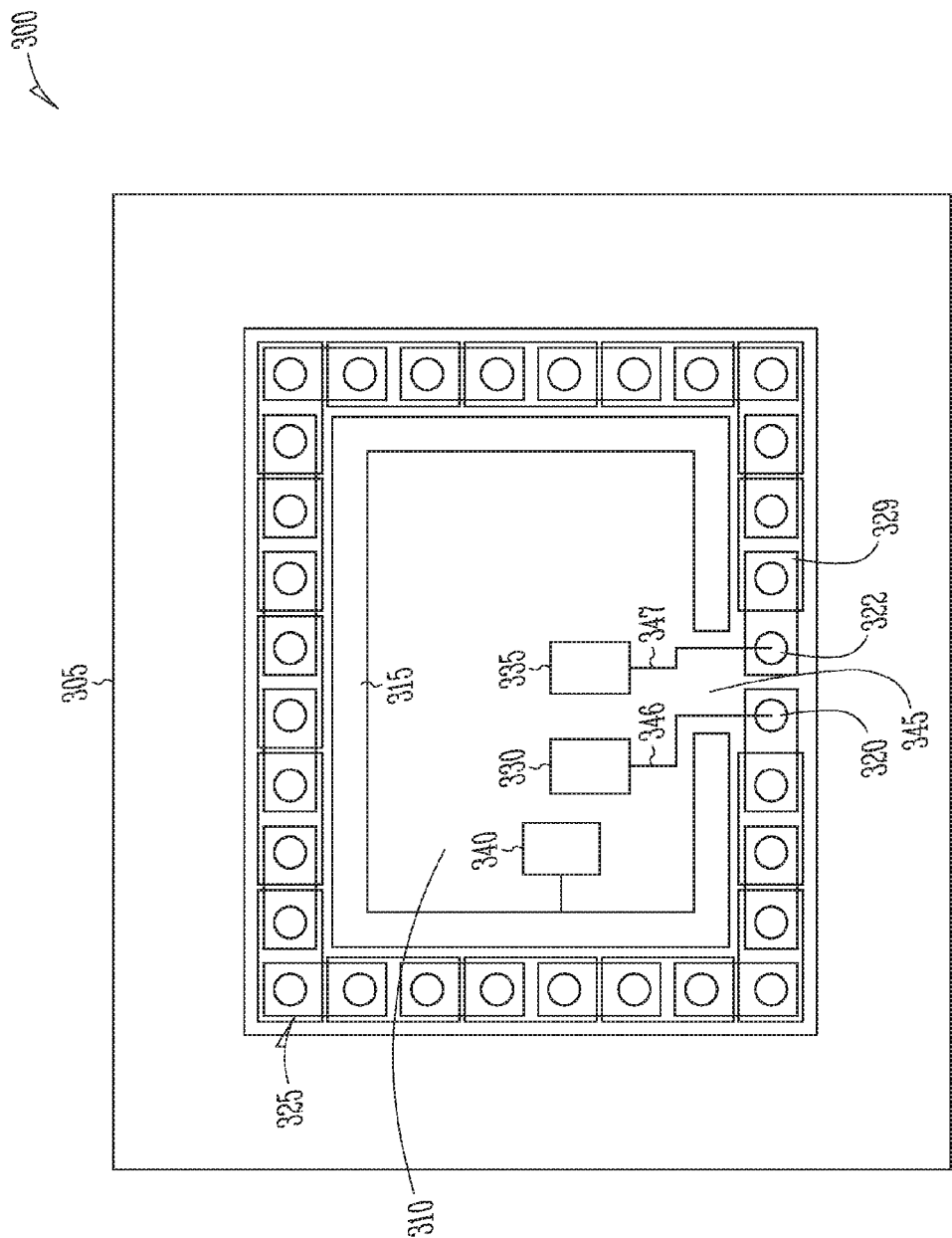
FIG. 3 is a block diagram of an apparatus in the form of a semiconductor device including a via chain for crack detection according to various embodiments.

FIG. 3 is a block diagram of an apparatus in the form of a die 300 including a via chain 325 for crack detection according to various embodiments.

As discussed above with respect to FIG. 1, manufacturers may add a die seal 315 during wafer fabrication to help block cracks such as those produced by the scribing process. Cracks may propagate from the periphery 305 of the die 300 to the die seal 315. Example embodiments may provide methods and structures to electrically test for cracks that run substantially horizontally through the die 300. Example embodiments may also provide methods and structures to electrically test for cracks that are substantially vertical relative to conductive layers of the die 300.

Some example embodiments may include a via chain 325 around an outer circumference of the die seal 315 between the die seal 315 and the periphery 305 of the die 305.

As described above with respect to FIG. 1, example embodiments may include a first pad 330, coupled to a first end 320 of the via chain 325. Example embodiments may include a second pad 335 coupled to a second end 322 of the via chain 325. Example embodiments may further include a third pad 340 coupled to the die seal 315. The placement of the via chain 325 outside the die seal 315 may be operative to detect cracks before they get to the die seal 315 from the periphery 305. It will be noted that a gap 345 may be introduced within the die seal 315 to route leads 346, 347 from the pads 330, 335 to ends 320, 322 of the via chain 325.

As described above with respect to FIG. 1, circuitry coupled (e.g., during probe) to pads 330, 335 and/or 340 may detect that a break has occurred in the via chain 325, such as by detecting that an open circuit has occurred. Such circuitry may also detect that the chain 325 has shorted to the die seal 315. For example, cracks may allow metal to extrude from the die seal 315, creating a short circuit condition with the via chain 325, and the circuitry may be used to detect that short circuit condition by measuring electrical signals at one or more of the pads 330, 335 and 340.

Figure 4:
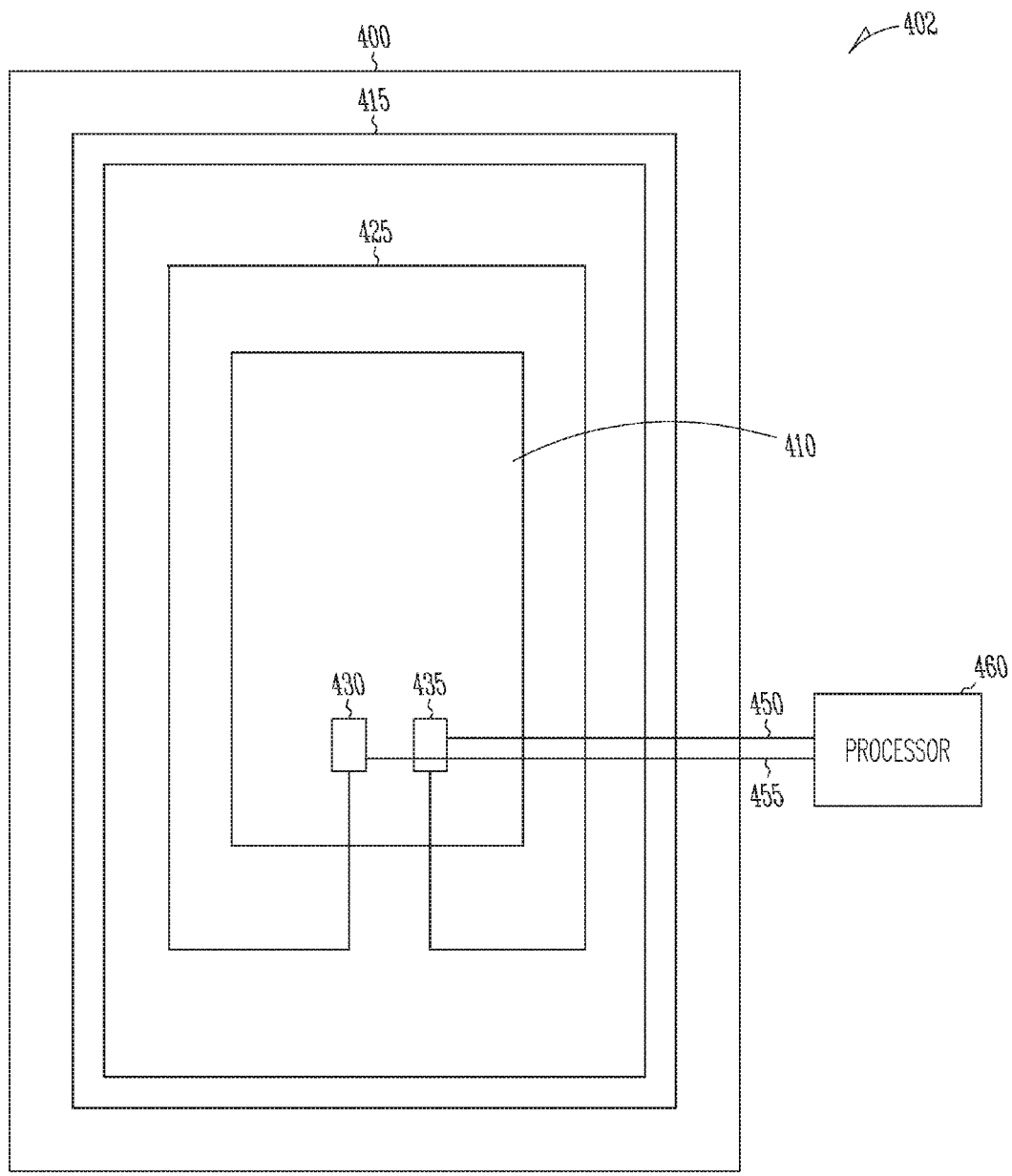
FIG. 4 is a block diagram of a system for testing for cracks in a die according to various embodiments.

FIG. 4 is a block diagram of a system 402 for testing for cracks in a die 400 according to various embodiments. The system 402 may include a die seal 415 between an integrated circuit region 410 of the die 400 and a periphery of the die 400. The die seal 415 may be operable to serve as the die seal 115 (FIG. 1) or 315 (FIG. 3).

The system 402 may include a via chain 425 arranged around a circumference of the die seal 415. The via chain 425 may be arranged around an inner circumference of the die seal 415 between the die seal 415 and the integrated circuit region 410. As described above with respect to FIGS. 1 and 3, a contact (not shown in FIG. 4) of the via chain 425 may extend through a portion of the die 400. The via chain 425 may, additionally or alternatively, be arranged around an outer circumference of the die seal 415 between the die seal 415 and the periphery of the die 400. The system 402 may include two or more via chains (not shown in FIG. 4). At least one via chain 425 may be arranged around an inner circumference of the die seal 415 and another may arranged around an outer circumference of the die seal 415.

The system 402 may include a first pad 430 coupled to a first end of the via chain 425. During probe, a probe pin 455 may connect to the first pad 430 and a processor 460 may receive signals from the probe pin 455. Another probe pin 450 may connect to a second pad 435. The processor 460 may receive signals from the probe pins 450, 455. The processor 460 may determine a failure condition of the die 400 based on signals received from the probe pins 450, 455. The pads 430, 435 may be operable to serve as the pads 130, 135 (FIG. 1) or the pads 330, 335 (FIG. 3). One or more of the probe pins 450, 455 may be used to apply a test voltage to the pads 330 and/or 335.

The system 402 may include a third pad (not shown in FIG. 4) coupled to the die seal 415. The system 402 may include additional probe pins or other devices (not shown in FIG. 4) for connecting the processor 460 to other portions of the integrated circuit region 410 for testing purposes or other purposes. The processor 460 may be included in an apparatus such as a high-speed computer, test module, tablet computer, laptop computer, or other computer or system that may be used in a manufacturing test environment.

Figure 5:
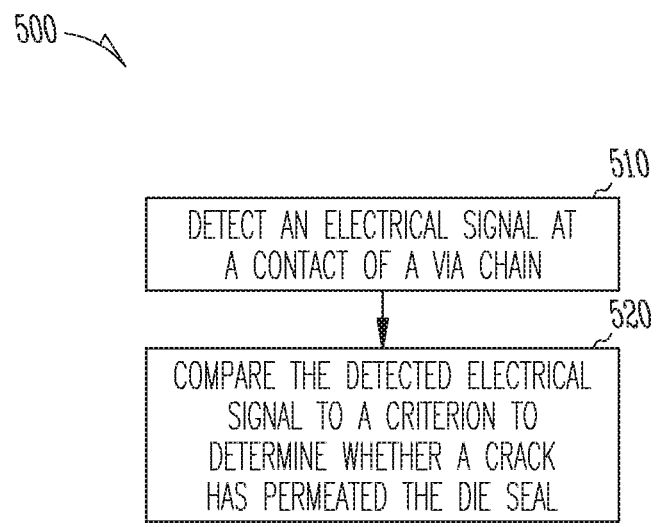
FIG. 5 is a flow diagram of a method for detecting a crack in a die according to various embodiments.

FIG. 5 is a flow diagram of a method 500 for detecting a crack in a die according to various embodiments. The method 500 may be performed by a system 402 (FIG. 4) that uses circuitry coupled to ends of the via chain 125 (FIG. 1) or 325 (FIG. 3) and/or to the die seal 115 (FIG. 1) and/or 315 (FIG. 3).

In operation 510, the system 402 may detect an electrical signal at an end of a via chain 125 (FIG. 1) or 325 (FIG. 3). As described above with respect to FIGS. 1 and 3, the via chain 125 may be arranged around an inner circumference of the die seal 115 between the die seal 115 and the integrated circuit region 110, or the via chain 325 may be arranged between a periphery of the die 300 and a die seal 315 of the die 300. The via chain 125 or 325 may include a plurality of contacts 120 or 320 comprised of conductive material extending through portions of the die 100 or 300.

In operation 520, the system 402 may compare the detected electrical signal to a criterion to determine whether a crack exists in the die. For example, a test voltage of known magnitude may be applied, through a probe pin 450 or 455 or through other circuitry. The via chain 125 may have a known resistance, determined at design time of the IC device. If the electrical current, as measured at one or more of pads 430, 435, and 440 is below a first threshold level, the system 402 may determine that an open circuit has occurred in the via chain 125. This condition may indicate that a crack has broken the via chain 125. If the measured current is above a second threshold level, the system 402 may determine that a short circuit has formed in the via chain 125. For example, metal may have extruded from the die seal 115 or 315 and contacted the via chain 125 or 325, creating a short circuit.

If the via chain 325 is arranged between the periphery 305 and the die seal 315 of the die, the system 402 may detect cracks between the periphery 305 and the die seal 315. If there are two via chains, one arranged around an inner circumference of the die seal and the other arranged around an outer circumference of the die seal, the system 402 may test both for cracks that permeated the die seal and for cracks that propagated from the periphery to the die seal.

Various embodiments may have more or fewer activities than those shown in FIG. 5. In some embodiments, the activities may be repeated, and/or performed in serial or parallel fashion. Some embodiments may comprise the same activities in a different order.

Although specific embodiments have been described, it will be evident that various modifications and changes may be made to these embodiments. Accordingly, the specification and drawings are to be regarded in an illustrative rather than a restrictive sense. The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for streamlining the disclosure. This method of disclosure is not to be interpreted as limiting the claims. Thus, the following claims are hereby incorporated into the Detailed Description, with each claim standing on its own as a separate embodiment.

What is claimed is:

1. A method for detecting a crack in a die having a die seal, the method comprising:

detecting an electrical signal at an end of a via chain, the via chain being arranged around a circumference of the die seal between a periphery of the die and the die seal, wherein a pad is arranged to be surrounded by the die seal and coupled to an end of the via chain, and wherein the die seal comprises a gap to route a lead for coupling the pad to the end of the via chain, the via chain including a plurality of contacts extending through portions of the die; and comparing the detected electrical signal to a criterion to determine whether a crack exists in the die.

2. The method of claim 1, wherein the comparing comprises:

determining that a crack exists in the die seal if the electrical signal has a value above or below a threshold range.

3. The method of claim 1, wherein an additional via chain is arranged around an inner circumference of the die seal between the die seal and an integrated circuit region of the die to detect an additional electrical signal at an end of the additional via chain.

4. The method of claim 1, wherein detecting an electrical signal at an end of a via chain comprises:

detecting an additional electrical signal at an end of the additional via chain arranged around the inner circumference of the die seal between the die seal and an integrated circuit region of the die.

5. The method of claim 1, wherein the pad comprises a first pad coupled to the end of the via chain, and a second pad coupled to another end of the via chain, and a third pad coupled to the die seal.

\* \* \* \* \*